(12) United States Patent
Huang et al.

(10) Patent No.: US 11,728,229 B2
(45) Date of Patent: Aug. 15, 2023

(54) DUMMY PATTERNS IN REDUNDANT REGION OF DOUBLE SEAL RING

(71) Applicant: Taiwan Semiconductor Manufacturing Company, Ltd., Hsinchu (TW)

(72) Inventors: Shan-Yu Huang, Zhubei (TW); Hsiao-Wen Chung, Taipei (TW); Yi-Lun Chen, Hsinchu (TW); Huang-Sheng Lin, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 216 days.

(21) Appl. No.: 17/336,977

(22) Filed: Jun. 2, 2021

(65) Prior Publication Data
US 2022/0310464 A1 Sep. 29, 2022

Related U.S. Application Data

(60) Provisional application No. 63/166,026, filed on Mar. 25, 2021.

(51) Int. Cl.
| | |
|---|---|
| *H01L 23/10* | (2006.01) |
| *H01L 23/58* | (2006.01) |
| *H01L 23/00* | (2006.01) |
| *H01L 23/31* | (2006.01) |

(52) U.S. Cl.
CPC .............. *H01L 23/10* (2013.01); *H01L 23/31* (2013.01); *H01L 23/562* (2013.01); *H01L 23/585* (2013.01); *H01L 2223/54466* (2013.01)

(58) Field of Classification Search
CPC ....... H01L 23/10; H01L 23/31; H01L 23/562; H01L 23/585; H01L 2223/54466
See application file for complete search history.

(56) References Cited

U.S. PATENT DOCUMENTS

| | | |
|---|---|---|
| 7,235,864 B2 | 6/2007 | Lee |
| 8,022,550 B2 | 9/2011 | Koubuchi et al. |
| 8,253,217 B2 | 8/2012 | Chen et al. |
| 8,334,582 B2 | 12/2012 | Jeng et al. |
| 8,395,239 B2 | 3/2013 | Chen et al. |
| 8,461,021 B2 | 6/2013 | Yaung et al. |
| 9,093,308 B2 | 7/2015 | Yang et al. |

(Continued)

OTHER PUBLICATIONS

Hisien-Wei Chen, "Advanced Seal Ring Structure and Method of Making the Same," U.S. Appl. No. 17/160,571, filed Jan. 28, 2021, Assignee: Taiwan Semiconductor Manufacturing Co., Ltd., Specification 25 pages, Drawings 13 pages.

*Primary Examiner* — Peniel M Gumedzoe
(74) *Attorney, Agent, or Firm* — Haynes and Boone, LLP

(57) ABSTRACT

A semiconductor structure that includes two circuit regions; two inner seal rings, each of the two inner seal rings surrounding one of the two circuit regions; an outer seal ring surrounding the two inner seal rings, wherein each of the inner seal rings and the outer seal ring has a substantially rectangular periphery with four interior corner seal ring structures; four first redundant regions between the two inner seal rings and the outer seal ring, each of the four first redundant regions being a substantially trapezoidal shape; and first dummy patterns substantially uniformly distributed in the four first redundant regions.

20 Claims, 8 Drawing Sheets

(56) References Cited

U.S. PATENT DOCUMENTS

| | | |
|---|---|---|
| 9,245,842 B2 | 1/2016 | Chen et al. |
| 9,437,739 B2 | 9/2016 | Yu et al. |
| 9,443,838 B2 | 9/2016 | Yang et al. |
| 10,229,889 B2 * | 3/2019 | Tatour .................. H01L 23/562 |
| 10,366,956 B2 | 7/2019 | Yang et al. |
| 10,373,865 B2 | 8/2019 | Yang et al. |
| 2014/0327115 A1 | 11/2014 | Vu et al. |
| 2015/0194455 A1 | 7/2015 | Ho |
| 2016/0013138 A1 | 1/2016 | Chen |
| 2018/0122751 A1 | 5/2018 | Chen et al. |
| 2022/0310464 A1 | 9/2022 | Huang |

* cited by examiner

_US 11,728,229 B2_

1

DUMMY PATTERNS IN REDUNDANT REGION OF DOUBLE SEAL RING

PRIORITY

This application claims the benefits to U.S. Provisional Application Ser. No. 63/166,026 filed Mar. 25, 2021, the entire disclosure of which is incorporated herein by reference.

BACKGROUND

In semiconductor technologies, a semiconductor wafer is processed through various fabrication steps to form integrated circuits (IC). Typically, several circuits or IC dies are formed onto the same semiconductor wafer. The wafer is then diced to cut out the circuits formed thereon. To protect the circuits from moisture degradation, ionic contamination, and dicing processes, a seal ring is formed around each IC die. This seal ring is formed during fabrication of the many layers that comprise the circuits, including both the front-end-of-line (FEOL) processing and back-end-of-line processing (BEOL). The FEOL includes forming transistors, capacitors, diodes, and/or resistors onto the semiconductor substrate. The BEOL includes forming metal layer interconnects and vias that provide routing to the components of the FEOL.

Although existing seal ring structures and fabrication methods have been generally adequate for their intended purposes, improvements are desired. For example, it is desired to form certain seal rings to be fully closed or partially closed depending on chip architecture.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
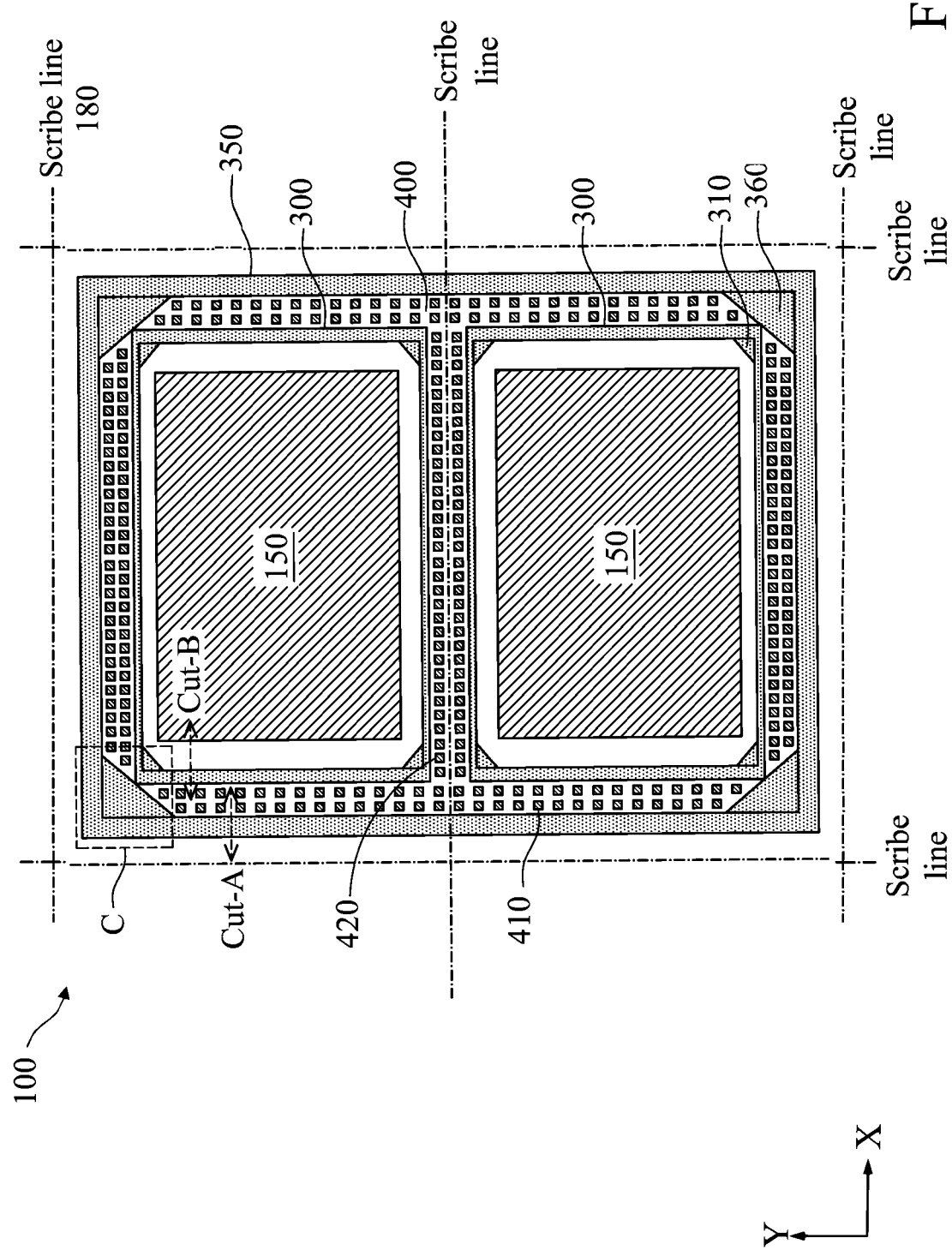
FIG. 1A and FIG. 1B are top plan views of a semiconductor structure with multiple circuit regions and multiple seal rings with (FIG. 1A) and without (FIG. 1B) showing dummy patterns in redundant regions according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to providing a seal ring structure that includes dual seal rings or double seal rings. The dual seal rings include an outer seal ring enclosing two or more inner seal rings. Each inner seal ring surrounds a circuit region (or an IC area or a chip area). Certain regions of the inner seal rings can be selectively formed to be open or closed depending on chip architecture. For example, two circuit regions may be formed to have interconnects (wafer-level interconnects) between them, thereby resulting in connected dies, or they may be formed as separate, individual dies. In the former situation, the inner seal rings surrounding each circuit region are partially open to allow interconnects to go through. In the latter situation, the inner seal rings surrounding each circuit region are fully closed. In either case, the outer seal ring is fully closed. In the former situation, the wafer is diced (or cut) outside of the outer seal ring, and the outer seal ring provides fully enclosed protection to the connected dies. In the latter situation, the wafer is diced between the inner seal rings, the outer seal ring is also cut, and the inner seal rings provide fully enclosed protection to individual dies.

In an embodiment of the present disclosure, the outer and the inner seal rings have the same shape and the same structure other than that the inner seal rings can be selectively open or closed. Further, each of the inner and the outer seal rings has a rectangular periphery (i.e., their exterior outline is rectangular or substantially rectangular) and four corner seal ring (CSR) structures at the four interior corners of the rectangular periphery. The CSR structures are triangular shaped for various mechanical concerns. The regions between the inner seal rings and the outer seal ring are relatively large, such as about 30 μm to 40 μm wide. These regions are referred to as redundant regions as they do not have circuit elements (i.e., elements that perform circuit functions). Similarly, a redundant region also exists between the inner seal rings. In the present disclosure, dummy patterns are uniformly placed in those redundant regions to reduce process variations and to improve chip area utilization. The dummy patterns are inserted at one or more layers of a wafer. For example, the dummy patterns may be inserted at diffusion layer, fin layer (for FinFETs), gate layer, contact layer, via layers, and metal layers (i.e., interconnect wiring layers). In an embodiment, the dummy patterns are inserted at each layer from the fin layer to the topmost metal layer. The dummy patterns may have different shapes among them, such as rectangular, square, long rectangles, etc. or may have a uniform shape (same shape). Inserting the dummy patterns substantially reduces or eliminates process variations (such as dishing) in the semiconductor structure 100 during chemical mechanical planarization (CMP) processing or other type of manufacturing processes. Those of ordinary skill in the art should appreciate that they may readily use the present disclosure as a basis for designing or modifying other processes and structures for carrying out the same purposes and/or achieving the same advantages of the embodiments introduced herein.

Figure 1B:
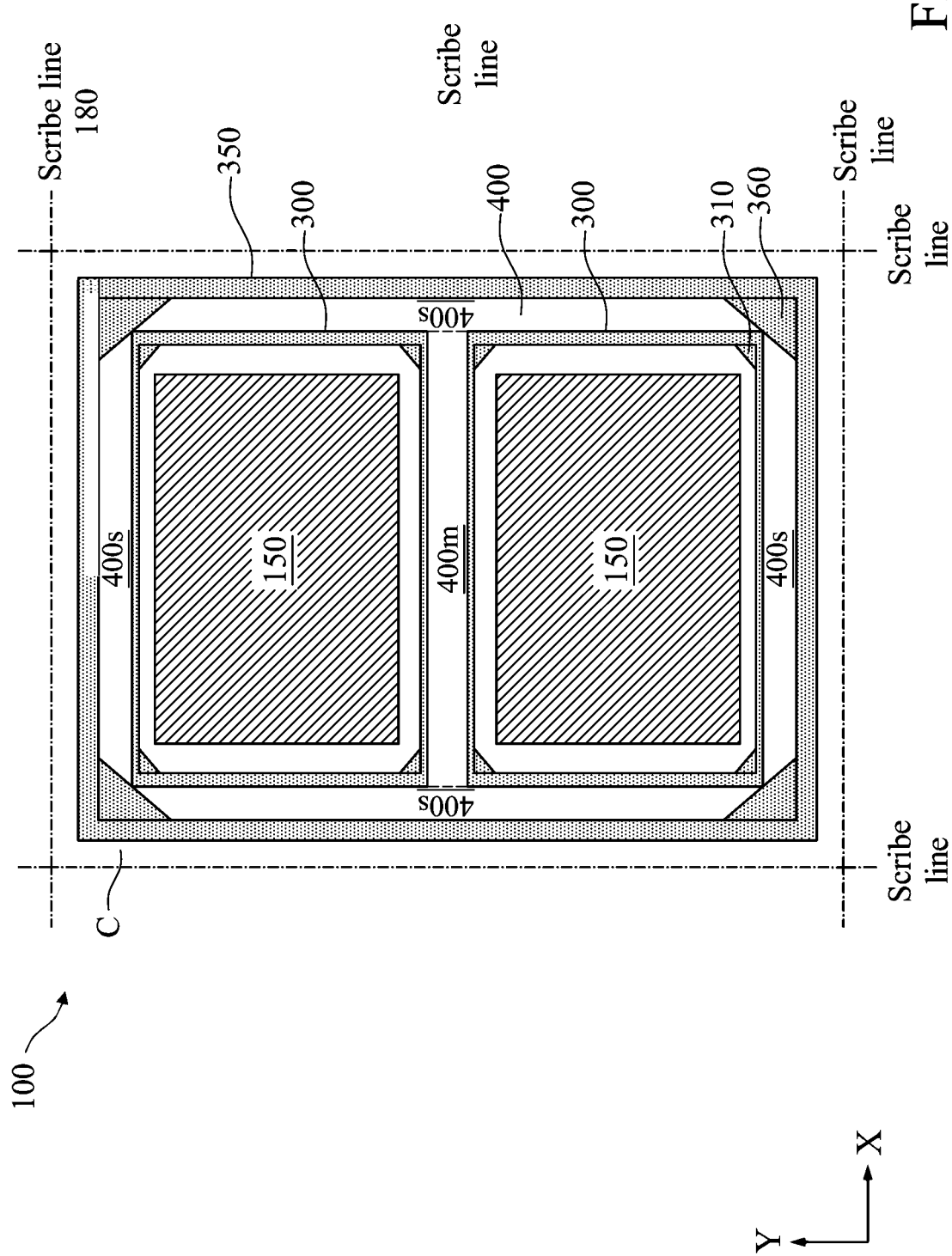

FIG. 1A is a top plan view of a semiconductor structure (or semiconductor device) 100 with dummy patterns 410 and 420 in redundant regions 400 according to an embodiment of the present disclosure. FIG. 1B is a top plan view of the semiconductor structure 100 of FIG. 1A without showing the dummy patterns 410 and 420 so that the redundant regions 400 (including redundant regions 400s and 400m) can be more clearly viewed.

Referring to FIGS. 1A and 1B collectively, the semiconductor structure 100 (such as a manufactured wafer or a part thereof) includes an outer seal ring 350 that encloses (or surrounds) multiple inner seal rings 300. Each inner seal ring 300 encloses a circuit region (or IC die) 150. The embodiment depicted in FIGS. 1A-1B shows two inner seal rings 300 enclosing two circuit regions 150. In other embodiments (not shown), the outer seal ring 350 may enclose more than two inner seal rings 300 and more than two circuit regions 150. In some embodiments, each circuit region 150 may perform the same function. For example, each circuit region 150 may be a memory chip or a processor chip. In some embodiments, the circuit regions 150 may perform different functions. For example, one circuit region 150 may be a transmitter chip (such as a wireless transmitter) and another circuit region 150 may be a receiver chip (such as a wireless receiver). In the embodiment depicted in FIG. 1A, each circuit region 150 is produced as an individual die or chip. For example, the semiconductor structure 100 is diced (or cut) along scribe lines 180 as illustrated in FIG. 1A. As a result, the outer seal ring 350 is also cut. The inner seal rings 300 stay intact during the dicing process and provide sealing and protective functions to each individual circuit region 150 (also referred to as individual dies 150 for this embodiment).

Figure 2:
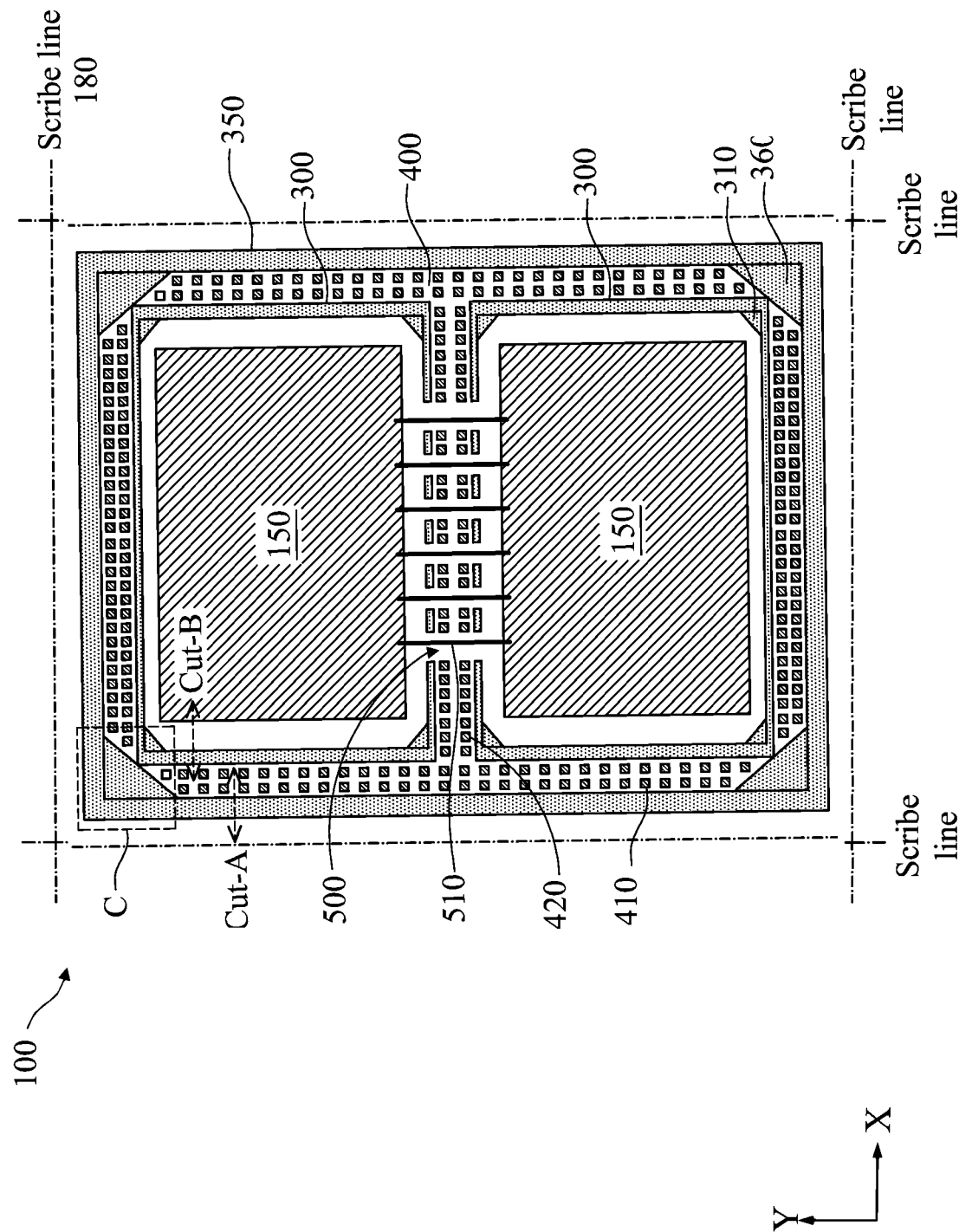
FIG. 2 is a top plan view of a semiconductor structure where inner seal rings are selectively opened, and interconnects are selectively formed between circuit regions according to aspects of the present disclosure.

FIG. 2 is a variant of the embodiment shown in FIGS. 1A-1B where inner seal rings 300 are formed with openings 500 at selective locations and interconnects 510 (which are conductors) are formed to connect multiple circuit regions 150 through the openings 500. The interconnects 510 are wafer-level (or die-level) interconnects, which advantageously have reduced resistance and better noise immunity than some off-chip interconnects. The interconnected circuit regions 150 (also referred to as connected dies 150 for this embodiment) form a larger system (or a system-on-wafer). In such embodiments, the semiconductor structure 100 is diced (or cut) along scribe lines 180 that are outside of the outer seal ring 350 as shown in FIG. 2. Thus, the outer seal ring 350 provides sealing and protective functions to the connected dies 150.

In an embodiment, the set of masks (referred to as mask set A) that are used to form the semiconductor structure 100 shown in FIG. 1A and the set of masks (referred to as mask set B) that are used to form the semiconductor structure 100 shown in FIG. 2 share some common masks. A mask is also referred to as a photo mask or photomask and is used to perform photolithography on semiconductor wafers to form features of the semiconductor structure 100. For example, mask set A and mask set B may share common masks for some of the diffusion layer, fin layer (for FinFETs), gate layer, contact layer, via layers, and metal layers. The fin layer refers to a semiconductor layer where semiconductor fins for FinFETs are formed protruding over a semiconductor substrate (such as a silicon substrate). The mask set A and the mask set B differ in those layers where the interconnects 510 are formed, such as some metal layers, particularly high-level metal layers, such as the fifth metal (M5) layer, the sixth metal (M6) layer, and/or other metal layers. By sharing masks between the mask set A and the mask set B, a manufacturer can selectively produce individual dies 150, connected dies 150, or both, with reduced total costs. For example, if each of the mask set A and the mask set B has N masks, the manufacturer may just need to produce M common masks, $N_1$ masks specifically for the mask set A, and $N_2$ masks specifically for the mask set B, where $M+N_1+N_2$ is less than 2N. The less number of masks produced, the less costs to the manufacturer. The individual dies 150 and the connected dies 150 may satisfy different market demands.

The outer seal rings 350 in the embodiments shown in FIGS. 1A and in FIG. 2 are the same. The inner seal rings 300 in the embodiments shown in FIGS. 1A and in FIG. 2 are the same except those openings 500 in FIG. 2. Thus, for simplicity purposes, the description of the inner seal rings 300 and the outer seal ring 350 below applies to both embodiments, unless it is about the openings 500.

Referring FIG. 1B, the outer seal ring 350 has a rectangular or substantially rectangular periphery. In other words, the exterior outline (or exterior boundary) of the outer seal ring 350 is rectangular or substantially rectangular. The outer seal ring 350 further includes four corner seal ring (CSR) structures 360 at the four interior corners of the rectangular or substantially rectangular periphery. In an embodiment, the CSR structure 360 is triangular or substantially triangular. For example, the periphery of each CSR structure 360 is a right triangle or a right isosceles triangle. The legs of the triangle run parallel to the edges of the periphery of the outer seal ring 350, and the hypotenuse of the triangle is adjacent the inner seal rings 300. The CSR structures 360 provide various mechanical benefits to the outer seal ring 350, such as preventing layer peeling at the corner of the chips during dicing processes. With the CSR structures 360, the interior outline (or interior boundary) of the outer seal ring 350 is octagonal or substantially octagonal.

Still referring to FIG. 1B, each inner seal ring 300 has the same structure as the outer seal ring 350. In other words, each inner seal ring 300 has a rectangular or substantially rectangular periphery and has four CSR structures 310 at the four interior corners of the rectangular or substantially rectangular periphery. The interior outline (or interior boundary) of each inner seal ring 300 is octagonal or substantially octagonal. Using the same structure in both the inner seal rings 300 and the outer seal ring 350 advantageously reduces the manufacturer's time spent on qualifying different seal ring structures. In the present embodiment, the inner seal rings 300 are placed as close to the outer seal ring 350 as possible to reduce the total footprint of the structure. For example, the exterior corners of the inner seal rings 300 may be placed right next to (i.e., abutting) the hypotenuse of the CSR structures 360. However, even with such placement, there are still empty regions 400s between the inner seal rings 300 and the outer seal ring 350, where no circuit elements or seal ring structures exist. The empty regions 400s are also referred to as redundant regions 400s. As shown in FIG. 1B, each redundant region 400s has a trapezoidal shape or a substantially trapezoidal shape. In a further embodiment, each redundant region 400s is an isosceles trapezoid with its legs being part of the hypotenuse of the CSR structures 360. In an embodiment, the height of the trapezoidal shape is in a range of about 30 µm to 40 µm, and the length of the trapezoidal shape is in a range of about 1 mm to 26 mm for the top and bottom redundant regions 400s and about 2 mm to about 66 mm for the left and right redundant regions 400s. The height of the trapezoidal shape is the dimension along "Y" direction for the top and bottom redundant regions 400s and the dimension along "X" direction for the left and right redundant regions 400s. The length of the trapezoidal shape is the dimension along "X" direction for the top and bottom redundant regions 400s and the dimension along "Y" direction for the left and right redundant regions 400s.

Furthermore, the region between the inner seal rings 300 is also a redundant region 400m in some embodiments (such as the embodiment of FIG. 1A), while part of it becomes a circuit region in alternative embodiments (such as the embodiment of FIG. 2). The redundant region 400m is rectangular or substantially rectangular in an embodiment. In an embodiment, the redundant region 400m has a width (along "Y" direction) of about 60 µm to about 200 µm (such as about 65 µm to about 180 µm) and a length (along "X" direction) of about 1 mm to about 26 mm. In the following discussion, both the redundant regions 400s and the redundant region 400m are referred to as redundant regions 400.

Given the size of the redundant regions 400, it is highly desirable that they are utilized to provide benefits to the semiconductor structure 100. In the present embodiment, dummy patterns are inserted into the redundant regions 400, including dummy patterns 410 in the redundant regions 400s and dummy patterns 420 in the redundant regions 400m. Inserting dummy patterns 410 and 420 into the redundant regions 400 advantageously reduces process variations, such as reducing or eliminating dishing effects during chemical mechanical planarization (CMP). In the present embodiment, the dummy patterns 410 are inserted uniformly or substantially uniformly in the redundant regions 400s. Further, the dummy patterns 420 in the redundant regions 400m are selectively inserted depending on whether the interconnects 510 are formed. For example, if the interconnects 510 are not formed (such as shown in FIG. 1A), then the dummy patterns 420 are inserted uniformly or substantially uniformly in the redundant region 400m. If the interconnects 510 are formed (such as shown in FIG. 2), then the dummy patterns 420 are inserted uniformly or substantially uniformly in the redundant region 400m outside the area defined for the interconnects 510. For example, if the interconnects 510 are formed in selective areas at the M6 layer and not at the M5 layer, then the dummy patterns 420 are inserted uniformly or substantially uniformly in the redundant region 400m at the M6 layer and outside the area defined for the interconnects 510 and are also inserted uniformly or substantially uniformly in the redundant region 400m at the M5 layer.

In an embodiment, the dummy patterns 410 and 420 are of rectangular shapes (including long and/or short rectangles), square shapes, or other shapes. The shapes of the dummy patterns 410 and 420 may be uniform in an embodiment. In an alternative embodiment, the shapes of the dummy patterns 410 and 420 may be non-uniform, i.e., having mixed shapes among them. Further, the dummy patterns 410 and 420 can be of any size as long as they meet the design rules for the manufacturing process. In an embodiment, the dummy patterns 410 and 420 at the same layer of the semiconductor structure 100 are separate from each other (i.e., they are not connected), with spacing among them satisfying the design rules for the manufacturing process. Further, the dummy patterns 410 and 420 at vertically adjacent layers of the semiconductor structure 100 may be connected. For example, the dummy patterns 410 and 420 at a via layer and those at a metal layer above the via layer may be vertically (i.e., into the page of FIG. 1A and FIG. 2) connected. In an embodiment, the dummy patterns 410 and 420 are present at each layer of the semiconductor structure 100 where protruding circuit features are present in the circuit regions 150. For example, the dummy patterns 410 and 420 may be present at the fin layer, the gate layer, the contact layer, the via layers, and the metal layers of the semiconductor structure 100. For these layers, having the dummy patterns 410 and 420 in the redundant regions 400 can effectively reduce or eliminate dishing effects during CMP because the pattern density in the inner seal rings 300, the outer seal ring 350, the redundant regions 400, and the circuit regions 150 may be controlled to be about the same.

Figure 3:
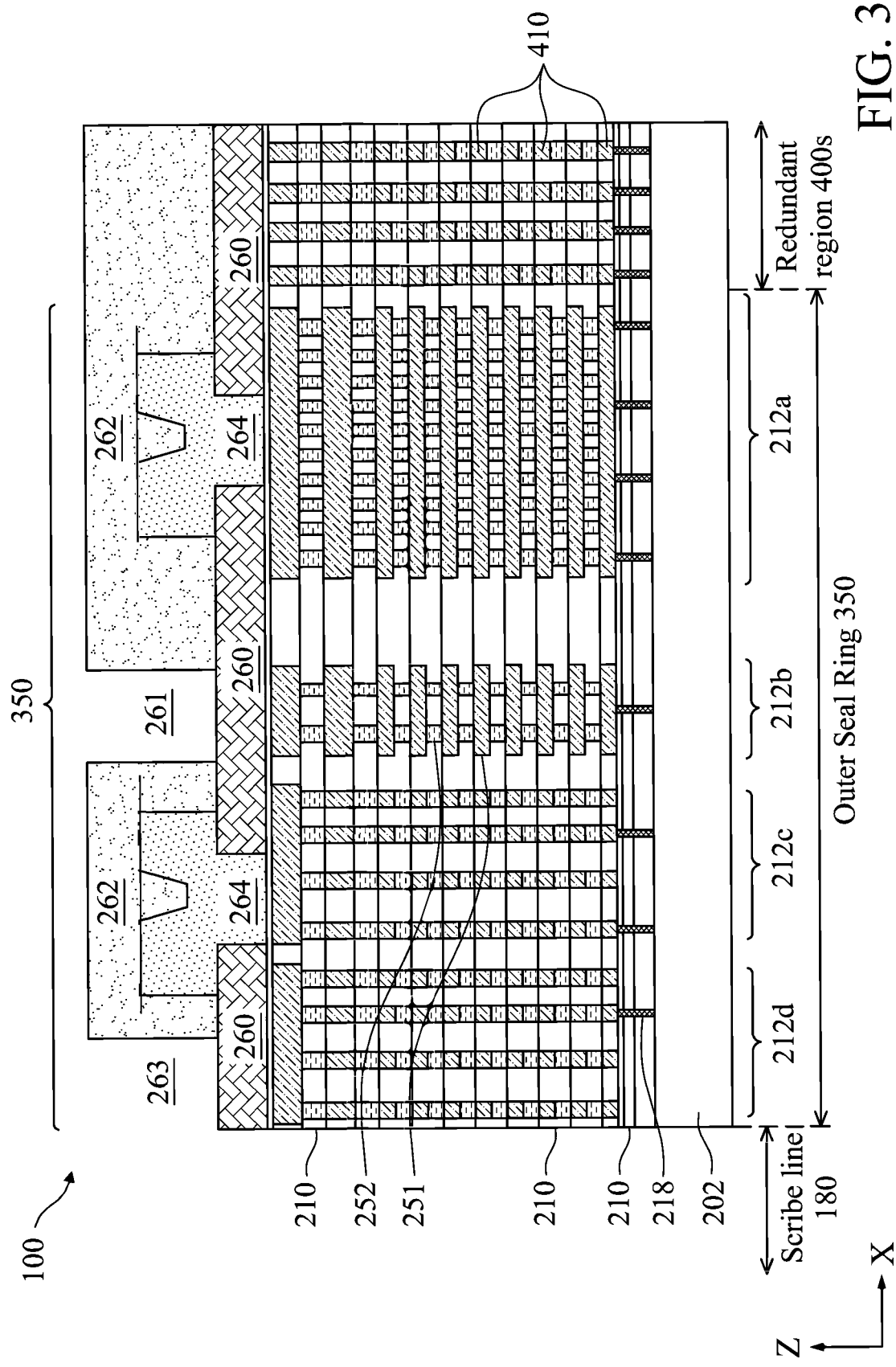
FIG. 3 is a cross-sectional view of a portion of the semiconductor structure shown in FIGS. 1A and 2 along the "Cut-A" line of FIGS. 1A and 2, according to various aspects of the present disclosure.

FIG. 3 shows a cross-sectional view of a portion of the semiconductor structure 100 along the "Cut-A" line of FIG. 1A, according to various aspects of the present disclosure. It is also a cross-sectional view of a portion of the semiconductor structure 100 along the "Cut-A" line of FIG. 2 because the embodiments shown in FIG. 1A and FIG. 2 are the same in this cross-sectional view. Referring to FIG. 3, the outer seal ring 350 includes multiple sub seal rings such as sub seal rings 212a, 212b, 212c, and 212d, which will be further discussed below. Further, the dummy patterns 410 are present in the redundant region 400s. In this embodiment, the dummy patterns 410 at different layers of the semiconductor structure 100 are connected. In an alternative embodiment, the dummy patterns 410 at different layers of the semiconductor structure 100 are not connected.

Referring to FIG. 3, the semiconductor structure 100 includes a substrate 202. The substrate 202 is a silicon substrate in the present embodiment. The substrate 202 may alternatively include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof.

Figure 7:
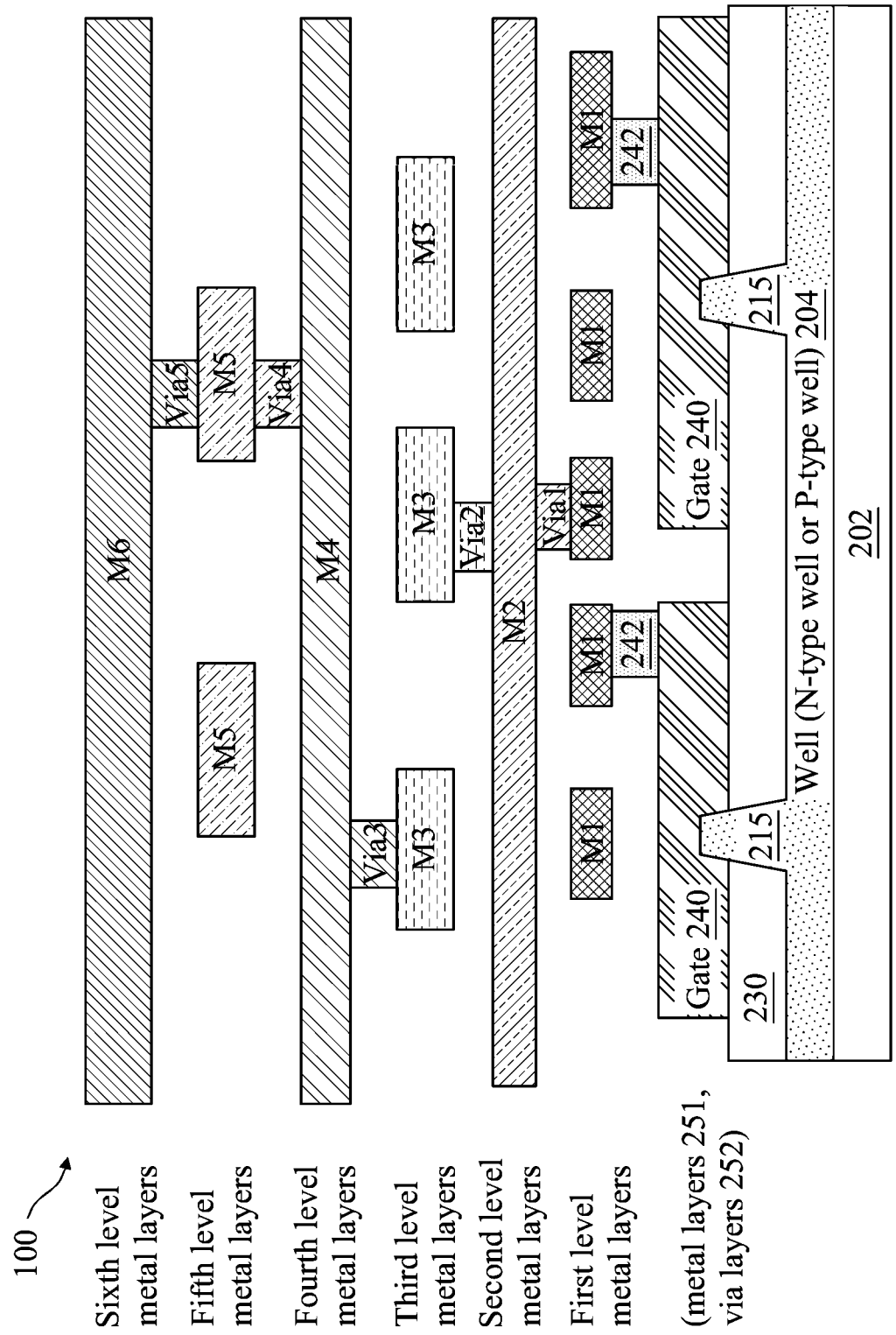
FIG. 7 shows a cross-sectional view of various layers of the semiconductor structure shown in FIGS. 1A and 2, according to an embodiment of the present disclosure.

The substrate 202 may include doped active regions such as a P-well and/or an N-well 204 (see FIG. 7). The substrate 202 may also further include other features such as a buried layer, and/or an epitaxy layer. Furthermore, the substrate 202 may be a semiconductor on insulator such as silicon on insulator (SOI). In other embodiments, the substrate 202 may include a doped epitaxy layer, a gradient semiconductor layer, and/or may further include a semiconductor layer overlying another semiconductor layer of a different type such as a silicon layer on a silicon germanium layer. The substrate 202 includes active regions (such as $N^+$ or $P^+$ doped regions) that are configured as an NMOS device (e.g., nFET) or a PMOS device (e.g., pFET). The substrate 202 may include underlying layers, devices, junctions, and other features (not shown). The outer seal ring 350, the inner seal rings 300, the redundant regions 400 along with dummy patterns 410 and 420, and the circuit regions 150 are built in or on the substrate 202. The substrate 202 further includes an assembly isolation 170 (FIG. 4) between the inner seal rings 300 and the circuit regions 150 and scribe line regions (for scribe lines 180) surrounding the outer seal ring 350 and optionally going through the outer seal ring 350.

The outer seal ring 350 includes the sub seal rings 212a, 212b, 212c, and 212d. The sub seal ring 212a is wider than the other sub seal rings, thus may be referred to as the main sub seal ring. Having multiple nested sub seal rings ensures that at least the inner sub seal ring(s) is/are protected from cracks during dicing (e.g., die sawing). For example, the sub seal rings 212c and 212d can protect the sub seal rings 212a and 212b from damages that may occur during dicing.

Each of the sub seal rings 212a, 212b, 212c, and 212d includes one or more conductive features 218 disposed on the substrate 202, such as disposed on active regions of the substrate 202. The conductive features 218 may include multiple conductors vertically stacked, and may include doped semiconductors, metals, conductive nitride, conductive oxide, or other types of conductive materials. Over the conductive features 218, each of the sub seal rings 212a, 212b, 212c, and 212d further includes multiple metal layers 251 stacked one over another and vertically connected by metal vias 252. Metal layers 251 and metal vias 252 may comprise copper, copper alloys, or other conductive materials and may be formed using damascene or dual damascene processes. Each of the metal layers 251 and the metal vias 252 may include a conductive barrier layer (such as TiN or TaN) surrounding a metal core (such as copper). In an embodiment, each of the metal layers 251 is formed into a ring or a ring-like structure (such as a substantially square ring) that surrounds the inner seal rings 300 and the circuit regions 150. In other words, each of the metal layers 251 is formed into a closed structure and extends along the edges of the area occupied by the inner seal rings 300 and the circuit regions 150. In the present embodiment, a ring or a ring-like structure refers to a closed structure, which may be rectangular, square, substantially rectangular, substantially square, or in other polygonal shapes. In an embodiment, the outer vias 252 (the vias 252 that are the closest and the furthest, respectively, from the inner seal rings 300 and the circuit regions 150) are formed into the shape of a ring. Thus, they are also referred to as via bars. The inner vias 252 are formed into discrete vias that form a line parallel to the outer vias 252. In the present embodiment, each of the sub seal rings 212a and 212c further includes an aluminum pad 264.

The conductive features 218, the metal layers 251, and the metal vias 252 are embedded in dielectric layers 210. The dielectric layers 210 may include silicon oxide, silicon nitride, silicon oxynitride, low-k dielectric materials, extreme low-k (ELK) dielectric materials, or other suitable dielectric materials (for example, including silicon, oxygen, nitrogen, carbon, or other suitable isolation constituent), or combinations thereof. The semiconductor structure 100 further includes a passivation layer 260 over the dielectric layers 210 and another passivation layer 262 over the passivation layer 260. Each of the aluminum pads 264 includes a top portion that is disposed over the passivation layer 260 and a bottom portion that penetrates the passivation layer 260 and electrically connects to the sub seal rings 212a and 212c. In an embodiment, each of the aluminum pads 264 is formed into a shape of a ring that surrounds the inner seal rings 300 and the circuit regions 150. Thus, the aluminum pads 264 may also be referred to as aluminum rings 264. Aluminum pads 264 may be formed simultaneously with the formation of bond pads (not shown) that are exposed on the top surface of circuit regions 150. The passivation layer 262 is disposed over the passivation layer 260 and the aluminum pads 264. Passivation layers 260 and 262 may be formed of oxides, nitrides, and combinations thereof, and may be formed of the same or different materials.

A trench 261 is provided in the passivation layer 262 above the sub seal ring 212b. Another trench 263 is provided in the passivation layer 262 above the sub seal ring 212d. In an embodiment, each of the trenches 261 and 263 is formed into a shape of a ring surrounding the inner seal rings 300 and the circuit regions 150. An advantageous feature of the dual trenches 261, 263 is that if a crack occurs in the scribe line during dicing, the crack will be stopped by the trench 263. Even if the crack propagates across the trench 263, if at all, the stress of the crack is substantially reduced by the trench 261. The semiconductor structure 100 may include other features and layers not shown in FIG. 3.

As shown in FIG. 3, the dummy patterns 410 are inserted at each layer where there are features (or conductive features) in the outer seal ring 350. In the embodiment depicted in FIG. 3, the dummy patterns 410 at adjacent layers of the semiconductor structure 100 are connected. In an alternative embodiment, the dummy patterns 410 at adjacent layers of the semiconductor are separate from each other, or some of the dummy patterns 410 are vertically connected and some of the dummy patterns 410 are vertically disconnected or discrete.

Figure 4:
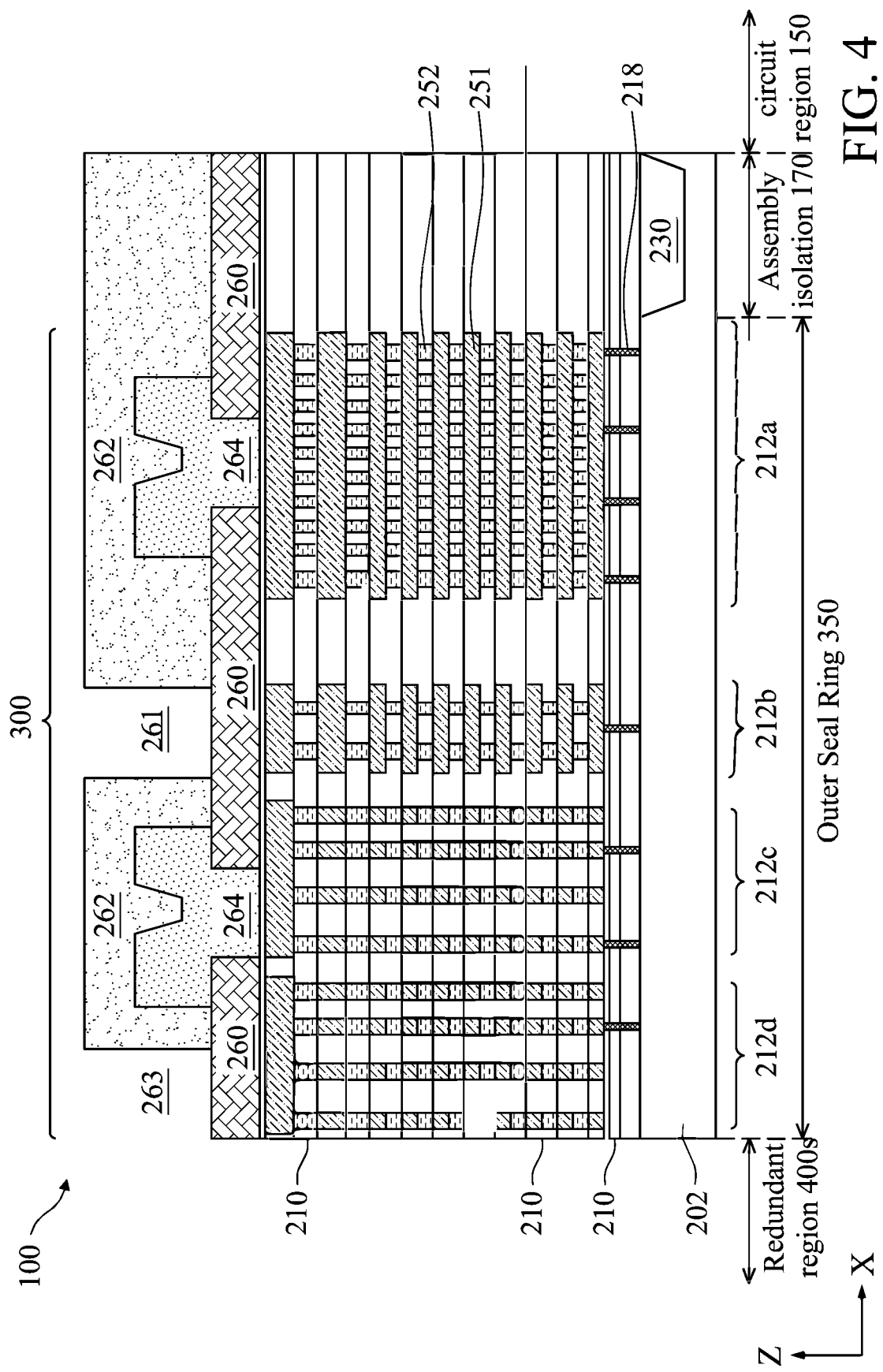
FIG. 4 is a cross-sectional view of a portion of the semiconductor structure shown in FIGS. 1A and 2 along the "Cut-B" line of FIGS. 1A and 2, according to various aspects of the present disclosure.

FIG. 4 shows a cross-sectional view of a portion of the semiconductor structure 100 along the "Cut-B" line of FIG. 1A, according to various aspects of the present disclosure. It is also a cross-sectional view of a portion of the semiconductor structure 100 along the "Cut-B" line of FIG. 2 because the embodiments shown in FIG. 1A and FIG. 2 are the same in this cross-sectional view. Referring to FIG. 4, similar to the outer seal ring 350, the inner seal ring 300 also includes multiple sub seal rings such as sub seal rings 212a, 212b, 212c, and 212d. The features of the inner seal ring 300 are the same as those of the outer seal ring 350, other than that, for example, the dimensions of the sub seal rings may be different between them.

The semiconductor structure 100 further includes an assembly isolation 170 between the inner seal ring 300 and the circuit region 150. The assembly isolation 170 includes an isolation structure (such as shallow trench isolation) 230. The isolation structure 230 may include silicon oxide, silicon nitride, silicon oxynitride, other suitable isolation material (for example, including silicon, oxygen, nitrogen, carbon, or other suitable isolation constituent), or combinations thereof. Isolation structure 230 can include different structures, such as shallow trench isolation (STI) structures and/or deep trench isolation (DTI) structures. In some embodiments, the semiconductor structure 100 may include various dummy lines and dummy vias in the assembly isolation 170.

Figure 5:
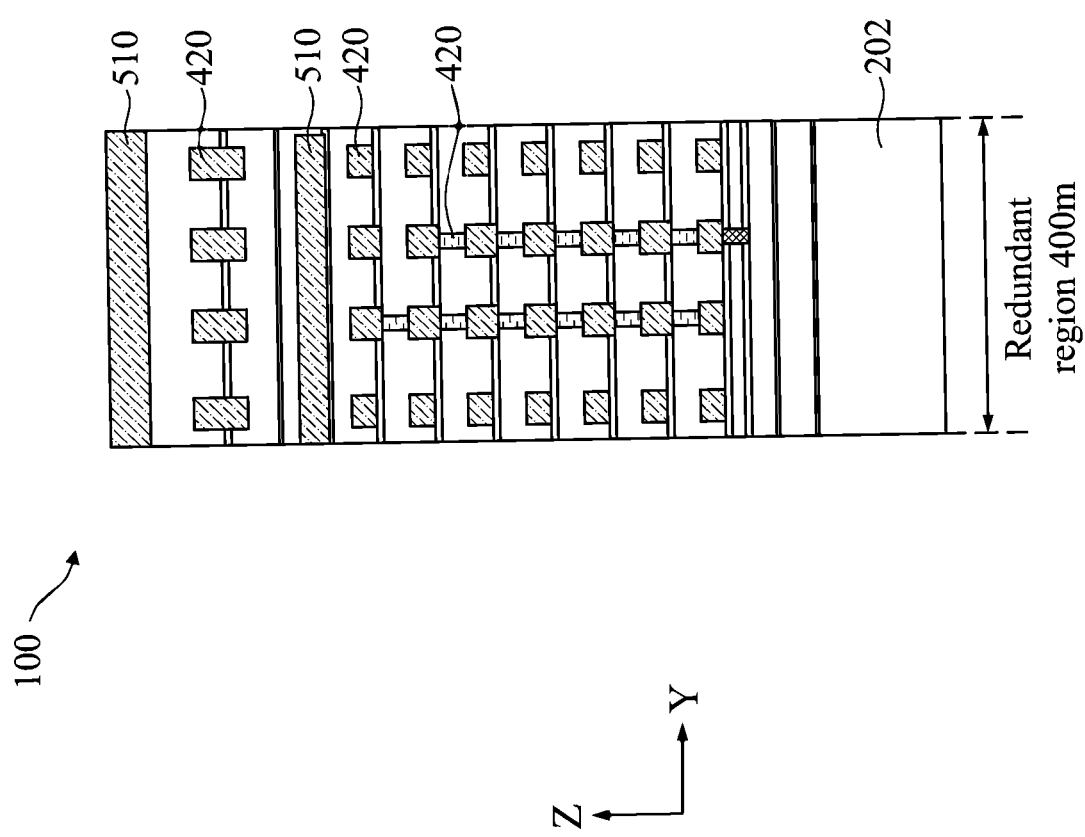
FIG. 5 is a cross-sectional view of a portion of the semiconductor structure shown in FIG. 2 along one of the interconnects between circuit regions, according to various aspects of the present disclosure.

FIG. 5 shows a cross-sectional view of a portion of the semiconductor structure 100 along some of the interconnects 510 of FIG. 2 (along the "Y" direction), according to an embodiment. In this embodiment, an interconnect 510 is formed at the highest metal layer (the $10^{th}$ metal layer in this example), dummy patterns 420 are also formed at the metal layer at the second highest metal layer (the $9^{th}$ metal layer in this example), another interconnect 510 is formed at the third highest metal layer (the $8^{th}$ metal layer in this example), and dummy patterns 420 are formed at the metal layers below the third highest metal layer. The dummy patterns 420 are isolated from the interconnects 510. The manufacturer may form the interconnects 510 at any metal layers (usually a selected few metal layers to enable maximum mask sharing between the embodiments shown in FIG. 1A and FIG. 2) and form the dummy patterns 420 in other metal layers that the interconnects 510 do not exist as well as the via layers. Even in the metal layers where the interconnects 510 are formed, the dummy patterns 420 may be inserted in areas adjacent to the interconnects 510 at the same layer (such as shown in FIG. 2). Further, even though not shown, the openings 500 are formed in the inner seal rings 300 at the $10^{th}$ and the $8^{th}$ metal layers in the above example to allow the interconnects 510 to go through, and the inner seal rings 300 are fully closed in other layers. To further this example, the mask set A (for the embodiment of FIG. 1A) and the mask set B (for the embodiment of FIG. 2) may only differ in the $10^{th}$ and the $8^{th}$ metal layers while sharing common masks for other layers.

Figure 6:
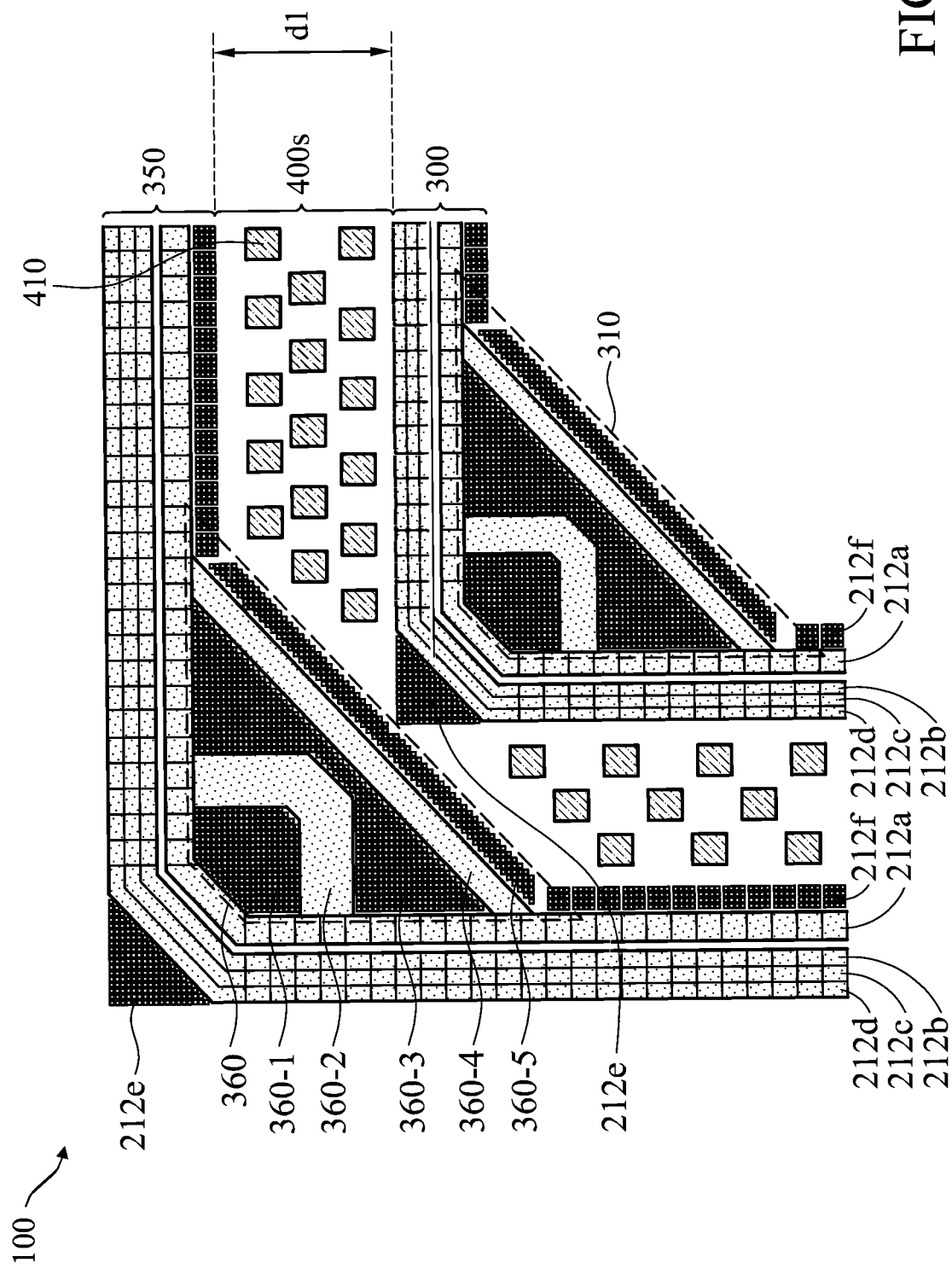
FIG. 6 is a closeup top plan view of the semiconductor structure shown in the area C in FIGS. 1A and 2 according to an embodiment of the present disclosure.

FIG. 6 shows a closeup top plan view of the semiconductor structure 100 shown in the area C in FIGS. 1A and 2 according to an embodiment of the present disclosure. Referring to FIG. 6, each of the outer seal ring 350 and the inner seal ring 300 includes the sub seal rings 212a, 212b, 212c, and 212d. The outer seal ring 350 includes an interior CSR structure 360. The inner seal ring 300 includes an interior CSR structure 310. Each of the outer seal ring 350 and the inner seal ring 300 further includes an exterior corner structure 212e which includes multiple discrete features that form a triangular or substantially triangular shape. For each sub seal ring 212a, 212b, 212c, and 212d, its top portion and side portion are connected by a sloped section. The exterior corner structure 212e is disposed next to the sloped section of the sub seal ring 212d. The exterior corner structure 212e and the top and side portions of the sub seal ring 212d form a right angle or an approximately right angle. To the interior of the sub seal ring 212a, each of the outer seal ring 350 and the inner seal ring 300 further includes an interior linear structure 212f that includes multiple discrete metal features that form a linear or substantially linear shape. The space from the interior linear structure 212f of the outer seal ring 350 to the sub seal ring 212d and the exterior corner structure 212e of the inner seal ring 300 is the redundant region 400s. The width d1 of the redundant region 400s is about 30 μm to about 40 μm in an embodiment. The dummy patterns 410 are placed inside the redundant region 400s. The CSR structure 360 includes multiple sections 360-1, 360-2, 360-3, 360-4, and 360-5. Each of the sections 360-1, 360-3, and 360-5 includes multiple discrete features. The section 360-2 is a long continuous feature that is "L" shaped. The section 360-4 is a long continuous linear feature. Both the sections 360-2 and 360-4 are connected to the sub seal ring 212a. The tip of the exterior corner structure 212e of the inner seal ring 300 abuts the section 360-5 of the CSR structure 360. The CSR structure 310 is similar in construction to the CSR structure 360.

FIG. 7 shows a cross-sectional view of the semiconductor structure 100, illustrating various layers therein including wells (or diffusion layer) 204, isolation structure 230, fin layer 215, gate layer 240, gate via layer 242, contact layer (not shown, but at the same level as the gate layer 240), contact via (or via0) layer (not shown, but at the same level as the gate via layer 242), the first through sixth metal (M1, M2, M3, M4, M5, and M6) layers 251, and the first through fifth via (via1, via2, via3, via4, and via5) layers 252. The semiconductor structure 100 may include other layers or features not shown in FIG. 7.

In an embodiment, the wells 204 are formed in or on the substrate 202 in the circuit regions 150. The wells 204 include p-type doped regions configured for n-type transistors, and n-type doped regions configured for p-type transistors. The fin layer 215 includes fin-shaped semiconductor material(s) (or fins) protruding from the substrate 202. In an embodiment, the fins for NMOSFET include single crystal-line silicon or intrinsic silicon or another suitable semiconductor material; and the fins for PMOSFET may comprise silicon, germanium, silicon germanium, or another suitable semiconductor material. In an embodiment, dummy patterns 410/420 are also formed in the fin layer, in the form of semiconductor fins, although they may or may not form functional transistors. The isolation structure 230 has been discussed earlier and isolates the fins.

The gate layer 240 includes gate structures having gate dielectric layer(s) and gate electrode layer(s). The gate dielectric layer(s) may include silicon dioxide, silicon oxynitride, and/or a high-k dielectric material such as $HfO_2$, $HfSiO$, $HfSiO_4$, $HfSiON$, $HfLaO$, $HfTaO$, $HfTiO$, $HfZrO$, $HfAlO_x$, $ZrO$, $ZrO_2$, $ZrSiO_2$, $AlO$, $AlSiO$, $Al_2O_3$, $TiO$, $TiO_2$, $LaO$, $LaSiO$, $Ta_2O_3$, $Ta_2O_5$, $Y_2O_3$, $SrTiO_3$, $BaZrO$, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide ($k \approx 3.9$). The gate electrode layer(s) may include titanium, aluminum, tantalum carbide, tantalum carbide nitride, tantalum silicon nitride, titanium nitride, tantalum nitride, ruthenium, molybdenum, tungsten, platinum, tungsten, cobalt, copper, and/or other suitable materials. In an embodiment, dummy patterns 410/420 are also formed in the gate layer, in the form of gate dielectric layer(s) and gate electrode layer(s), although they may or may not form functional transistor gates.

Each of the gate via layer 242, contact layer (not shown), contact via layer (not shown), the via layers 252, and the metal layers 251 may include titanium, tantalum, tungsten, cobalt, molybdenum, ruthenium, or a conductive nitride such as titanium nitride, titanium aluminum nitride, tungsten nitride, tantalum nitride, or combinations thereof, and may be formed by CVD, PVD, ALD, and/or other suitable processes. In an embodiment, dummy patterns 410/420 are also formed in each of the layers mentioned above and using the same material and process that form the corresponding features in the circuit regions 150.

Although not intended to be limiting, embodiments of the present disclosure provide one or more of the following advantages. For example, embodiments of the present disclosure provide a semiconductor structure with a dual seal ring structure. The dual seal ring structure includes an outer seal ring enclosing two or more inner seal rings. Each inner seal ring encloses a circuit region. The semiconductor structure can be used to form connected dies or individual dies. The outer seal ring provides the sealing and protective function to the connected dies. The inner seal rings provide the sealing and protective function to the individual dies. The outer seal ring and the inner seal rings have the same structure (both with interior corner seal ring structures) which is robust against stress during dicing. Redundant regions between the outer seal ring and the inner seal rings and redundant regions between the inner seal rings are filled uniformly with dummy patterns to reduce process variations and to balance the topography loading during various processes, including CMP. Further, in some embodiments, multiple (such as four) sub seal rings are formed in the outer seal ring and the inner seal rings to further improve the seal rings' operational reliability. Embodiments of the present disclosure can be readily integrated into existing semiconductor manufacturing processes.

In one example aspect, the present disclosure is directed to a semiconductor structure that includes two circuit regions; two inner seal rings, each of the two inner seal rings surrounding one of the two circuit regions; an outer seal ring surrounding the two inner seal rings, wherein each of the inner seal rings and the outer seal ring has a substantially rectangular periphery with four interior corner seal ring structures; four first redundant regions between the two inner seal rings and the outer seal ring, each of the four first redundant regions being a substantially trapezoidal shape; and first dummy patterns substantially uniformly distributed in the four first redundant regions.

In an embodiment, the semiconductor structure further includes a second redundant region between the two inner seal rings, the second redundant region being a rectangular shape and second dummy patterns substantially uniformly distributed in the second redundant region. In a further embodiment, the semiconductor structure is configured to be diced along the second redundant region and through the outer seal ring.

In an embodiment where the two inner seal rings have openings, the semiconductor structure further includes interconnects that go through the openings and electrically connect the two circuit regions. In a further embodiment, the semiconductor structure further includes second dummy patterns substantially uniformly distributed between the two inner seal rings and adjacent to the interconnects. In another further embodiment, the semiconductor structure is configured to be diced along an area that is outside of the outer seal ring.

In an embodiment, the first dummy patterns are present in each layer of the semiconductor structure in which vertically protruding circuit features are present at the circuit regions. In a further embodiment, the first dummy patterns at a same layer of the semiconductor structure are separate from each other. In another further embodiment, the first dummy patterns at two vertically adjacent layers of the semiconductor structure are vertically connected.

In another example aspect, the present disclosure is directed to a semiconductor structure that includes two circuit regions; two inner seal rings, each of the two inner seal rings surrounding one of the two circuit regions, wherein the two inner seal rings have openings; conductors going through the openings and connecting the two circuit regions; an outer seal ring surrounding the two inner seal rings and the conductors, wherein each of the inner seal rings and the outer seal ring has a substantially rectangular periphery with four interior corner seal ring structures; first redundant regions between the inner seal rings and the outer seal ring, each of the first redundant regions being a substantially isosceles trapezoidal shape with two legs each being an edge of one of the four interior corner seal ring structures; and first dummy patterns substantially uniformly distributed in each of the first redundant regions.

In an embodiment, the semiconductor structure further includes second dummy patterns substantially uniformly distributed between the two inner seal rings and adjacent to the conductors. In a further embodiment, some of the second dummy patterns are present in a layer below or above another layer where some of the conductors are present.

In another embodiment, the first dummy patterns are present in each layer of the semiconductor structure in which vertically protruding circuit features are present at the circuit regions. In a further embodiment, the first dummy patterns at a same layer of the semiconductor structure are separate from each other.

In yet another embodiment, the first dummy patterns are present at least in a fin layer, a gate layer, a contact layer, via layers, and metal layers of the semiconductor structure.

In yet another example aspect, the present disclosure is directed to a semiconductor structure that includes two circuit regions; two inner seal rings, each of the two inner seal rings surrounding one of the two circuit regions, wherein the two inner seal rings have openings; interconnects going through the openings and electrically connecting the two circuit regions; an outer seal ring surrounding the two inner seal rings and the interconnects, wherein each of the inner seal rings and the outer seal ring has a substantially rectangular periphery with corner seal ring structures disposed at four interior corners of the substantially rectangular periphery thereby providing a substantially octagonal interior boundary; first redundant regions between the inner seal rings and the outer seal ring; first dummy patterns substantially uniformly distributed in the first redundant regions; and second dummy patterns substantially uniformly distributed between the two inner seal rings and outside of an area defined for the interconnects.

In an embodiment, the first and the second dummy patterns are of rectangular or square shapes. In another embodiment, the first and the second dummy patterns are present at least in a gate layer, a contact layer, via layers, and metal layers of the semiconductor structure.

In an embodiment, the outer seal ring is free of openings. In another embodiment, each of the corner seal ring structures of the outer seal ring abuts an exterior corner of the inner seal rings.

In yet another example aspect, the present disclosure is directed to a semiconductor structure that includes a first inner seal ring having a first section and a second section perpendicular to the first section and an outer seal ring surrounding the first inner seal ring. The outer seal ring has a third section and a fourth section perpendicular to the third section, wherein the third section is parallel to the first section and the fourth section is parallel to the second section. The semiconductor structure further includes dummy patterns substantially uniformly distributed in a first region between the first section and the third section and in a second region between the second section and the fourth section.

In an embodiment, the semiconductor structure further includes a second inner seal ring having a fifth section and a sixth section perpendicular to the fifth section, wherein the outer seal ring further includes a seventh section perpendicular to the third section, wherein the third section is parallel to the fifth section and the sixth section is parallel to the seventh section, wherein the dummy patterns are substantially uniformly distributed in a third region between the fifth section and the third section and in a fourth region between the sixth section and the seventh section. In a further embodiment, the semiconductor structure includes first and second circuit regions that are surrounded by the first and the second inner seal rings respectively and interconnects going through openings in the first and the second inner seal rings and electrically connecting the first and the second circuit regions. In a further embodiment, the outer seal ring is free of openings.

In another embodiment, the dummy patterns are present at least in a gate layer, a contact layer, via layers, and metal layers of the semiconductor structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   two circuit regions;
   two inner seal rings, each of the two inner seal rings surrounding one of the two circuit regions;
   an outer seal ring surrounding the two inner seal rings, wherein each of the inner seal rings and the outer seal ring has a substantially rectangular periphery with four interior corner seal ring structures;
   four first redundant regions between the two inner seal rings and the outer seal ring, each of the four first redundant regions being a substantially trapezoidal shape; and
   first dummy patterns substantially uniformly distributed in the four first redundant regions.

2. The semiconductor structure of claim 1, further comprising:
   a second redundant region between the two inner seal rings, the second redundant region being a rectangular shape; and
   second dummy patterns substantially uniformly distributed in the second redundant region.

3. The semiconductor structure of claim 2, wherein the semiconductor structure is configured to be diced along the second redundant region and through the outer seal ring.

4. The semiconductor structure of claim 1, wherein the two inner seal rings have openings, further comprising:
   interconnects that go through the openings and electrically connect the two circuit regions.

5. The semiconductor structure of claim 4, further comprising:
   second dummy patterns substantially uniformly distributed between the two inner seal rings and adjacent to the interconnects.

6. The semiconductor structure of claim 5, wherein the semiconductor structure is configured to be diced along an area that is outside of the outer seal ring.

7. The semiconductor structure of claim 1, wherein the first dummy patterns are present in each layer of the semiconductor structure in which vertically protruding circuit features are present at the circuit regions.

8. The semiconductor structure of claim 7, wherein the first dummy patterns at a same layer of the semiconductor structure are separate from each other.

9. The semiconductor structure of claim 7, wherein the first dummy patterns at two vertically adjacent layers of the semiconductor structure are vertically connected.

10. A semiconductor structure, comprising:
    two circuit regions;
    two inner seal rings, each of the two inner seal rings surrounding one of the two circuit regions, wherein the two inner seal rings have openings;
    conductors going through the openings and connecting the two circuit regions;
    an outer seal ring surrounding the two inner seal rings and the conductors, wherein each of the inner seal rings and the outer seal ring has a substantially rectangular periphery with four interior corner seal ring structures;
    first redundant regions between the inner seal rings and the outer seal ring, each of the first redundant regions being a substantially isosceles trapezoidal shape with two legs each being an edge of one of the four interior corner seal ring structures; and
    first dummy patterns substantially uniformly distributed in each of the first redundant regions.

11. The semiconductor structure of claim 10, further comprising:
    second dummy patterns substantially uniformly distributed between the two inner seal rings and adjacent to the conductors.

12. The semiconductor structure of claim 11, wherein some of the second dummy patterns are present in a layer below or above another layer where some of the conductors are present.

13. The semiconductor structure of claim 10, wherein the first dummy patterns are present in each layer of the semiconductor structure in which vertically protruding circuit features are present at the circuit regions.

14. The semiconductor structure of claim 13, wherein the first dummy patterns at a same layer of the semiconductor structure are separate from each other.

15. The semiconductor structure of claim 10, wherein the first dummy patterns are present at least in a fin layer, a gate layer, a contact layer, via layers, and metal layers of the semiconductor structure.

16. A semiconductor structure, comprising:
    a first inner seal ring having a first section and a second section perpendicular to the first section;
    an outer seal ring surrounding the first inner seal ring, the outer seal ring having a third section and a fourth section perpendicular to the third section, wherein the third section is parallel to the first section and the fourth section is parallel to the second section; and
    dummy patterns substantially uniformly distributed in a first region between the first section and the third section and in a second region between the second section and the fourth section.

17. The semiconductor structure of claim 16, further comprising a second inner seal ring having a fifth section and a sixth section perpendicular to the fifth section, wherein the outer seal ring further includes a seventh section perpendicular to the third section, wherein the third section is parallel to the fifth section and the sixth section is parallel to the seventh section, wherein the dummy patterns are substantially uniformly distributed in a third region between the fifth section and the third section and in a fourth region between the sixth section and the seventh section.

18. The semiconductor structure of claim 17, further comprising:
   first and second circuit regions that are surrounded by the first and the second inner seal rings respectively; and
   interconnects going through openings in the first and the second inner seal rings and electrically connecting the first and the second circuit regions.

19. The semiconductor structure of claim 18, wherein the outer seal ring is free of openings.

20. The semiconductor structure of claim 16, wherein the dummy patterns are present at least in a gate layer, a contact layer, via layers, and metal layers of the semiconductor structure.

* * * * *